US012628264B2

(12) United States Patent
    Kishimoto et al.

(10) Patent No.: US 12,628,264 B2
(45) Date of Patent: May 12, 2026

(54) FLEXIBLE PRINTED CIRCUIT FINGER LAYOUT FOR LOW CROSSTALK

(71) Applicant: Western Digital Technologies, Inc., San Jose, CA (US)

(72) Inventors: Masahiro Kishimoto, Fujisawa (JP); John Contreras, Palo Alto, CA (US); Kazuhiro Nagaoka, Fujisawa (JP); Satoshi Nakamura, Yokohama (JP)

(73) Assignee: Western Digital Technologies, Inc., San Jose, CA (US)

( * ) Notice: Subject to any disclaimer, the term of this patent is extended or adjusted under 35 U.S.C. 154(b) by 272 days.

(21) Appl. No.: 18/379,587

(22) Filed: Oct. 12, 2023

(65) Prior Publication Data
    US 2024/0040688 A1      Feb. 1, 2024

Related U.S. Application Data

(62) Division of application No. 17/356,155, filed on Jun. 23, 2021, now Pat. No. 11,818,834.

(51) Int. Cl.
    H05K 1/02 (2006.01)
(52) U.S. Cl.
    CPC ........... H05K 1/0228 (2013.01); H05K 1/028 (2013.01); H05K 1/0298 (2013.01); *H05K 2201/10159* (2013.01)
(58) Field of Classification Search
    CPC .... H05K 1/0216; H05K 1/0228; H05K 1/028; H05K 1/0298; H05K 1/189; H05K 2201/10159; G11B 5/4806

USPC ..................................................... 361/679.33
See application file for complete search history.

(56) References Cited

U.S. PATENT DOCUMENTS

| | | | |
|---|---|---|---|
| 5,737,152 A | 4/1998 | Balakrishnan | |
| 5,995,238 A | 11/1999 | Yu | |
| 5,995,328 A * | 11/1999 | Balakrishnan ....... | G11B 5/4846 |
| 6,423,909 B1 | 7/2002 | Haynie et al. | |
| 7,609,482 B2 | 10/2009 | Kiyono | |
| 7,813,084 B1 * | 10/2010 | Hentges ................ | G11B 5/486 |
| | | | 360/245.9 |
| 8,208,226 B2 * | 6/2012 | Kawano ................. | G11B 5/486 |
| | | | 360/245.9 |
| 8,233,240 B2 | 7/2012 | Contreras et al. | |
| (Continued) | | | |

FOREIGN PATENT DOCUMENTS

| | | |
|---|---|---|
| CN | 101047015 A | 10/2007 |
| JP | H10125023 A | 5/1998 |
| (Continued) | | |

*Primary Examiner* — Timothy J Thompson
*Assistant Examiner* — Michael F Mcallister
(74) *Attorney, Agent, or Firm* — John D. Henkhaus

(57) ABSTRACT

A flexible printed circuit (FPC) for a hard disk drive includes a plurality of electrical traces, whereby aggressor traces are isolated from victim traces to avoid crosstalk that could degrade signals. Aggressor traces may be positioned together at one of the edges of each of the top wiring layer and the bottom wiring layer, physically isolated from victim traces. Aggressor traces may be grouped together at either the top wiring layer or the bottom wiring layer, with the victim traces positioned on the layer opposing the aggressor traces. With aggressor and victim traces routed on the same wiring layer, aggressor traces may be routed away from the victim traces with multi-layer routing, by way of vias.

19 Claims, 10 Drawing Sheets

(56)                    References Cited

U.S. PATENT DOCUMENTS

| | | | |
|---|---|---|---|
| 8,295,014 B1 | 10/2012 | Teo et al. | |
| 8,320,084 B1 | 11/2012 | Shun et al. | |
| 8,598,460 B2 | 12/2013 | Contreras et al. | |
| 8,879,212 B1 | 11/2014 | Huber | |
| 8,969,736 B2 | 3/2015 | Yamauchi | |
| 8,982,512 B1 | 3/2015 | Schreiber et al. | |
| 9,036,305 B1 * | 5/2015 | Contreras | H05K 1/025 |
| | | | 360/264.2 |
| 9,064,513 B1 | 6/2015 | Pan et al. | |
| 9,886,970 B1 | 2/2018 | Lammers et al. | |
| 10,594,100 B1 | 3/2020 | Namihisa et al. | |
| 10,779,402 B1 | 9/2020 | Ng et al. | |
| 2006/0152854 A1 | 7/2006 | Arya et al. | |
| 2007/0195463 A1 | 8/2007 | Erpelding | |
| 2007/0210070 A1 | 9/2007 | Contreras et al. | |
| 2009/0002888 A1 | 1/2009 | Jang | |
| 2009/0195935 A1 | 8/2009 | Choi | |
| 2009/0195999 A1 | 8/2009 | Honjo et al. | |
| 2010/0007993 A1 * | 1/2010 | Contreras | G11B 5/486 |
| | | | 360/245.8 |
| 2011/0149441 A1 | 6/2011 | Alex et al. | |
| 2012/0160548 A1 | 6/2012 | Contreras et al. | |
| 2016/0314808 A1 | 10/2016 | Twahara | |
| 2018/0132344 A1 | 5/2018 | Liao et al. | |
| 2019/0295600 A1 * | 9/2019 | Yoshikawa | G11B 5/4853 |

FOREIGN PATENT DOCUMENTS

| | | | |
|---|---|---|---|
| JP | 2010170647 A | 8/2010 | |
| JP | 2019212349 A | 12/2019 | |

* cited by examiner

READ-WRITE
HEAD

FOLD AREA

FLEXIBLE PRINTED CIRCUIT FINGER LAYOUT FOR LOW CROSSTALK

CROSS-REFERENCE TO RELATED APPLICATIONS

This application is a divisional of and claims the benefit of priority to U.S. patent application Ser. No. 17/356,155 filed Jun. 23, 2021, the entire content of which is incorporated by reference for all purposes as if fully set forth herein.

FIELD OF EMBODIMENTS

Embodiments of the invention may relate generally to hard disk drives, and particularly to approaches to avoiding crosstalk noise from aggressor electrical traces to sensor electrical traces in a flexible printed circuit.

BACKGROUND

A hard disk drive (HDD) is a non-volatile storage device that is housed in a protective enclosure and stores digitally encoded data on one or more circular disks having magnetic surfaces. When an HDD is in operation, each magnetic-recording disk is rapidly rotated by a spindle system. Data is read from and written to a magnetic-recording disk using a read-write head (or "transducer") that is positioned over a specific location of a disk by an actuator. A read-write head makes use of magnetic fields to write data to and read data from the surface of a magnetic-recording disk. A write head works by using the current flowing through its coil to produce a magnetic field. Electrical pulses are sent to the write head, with different patterns of positive and negative currents. The current in the coil of the write head produces a localized magnetic field across the gap between the head and the magnetic disk, which in turn magnetizes a small area on the recording medium.

To write data to the medium, or to read data from the medium, the head has to receive instructions from a controller. Hence, the head is connected to the controller in some electrical manner so that not only does the head receive instructions to read/write data, but the head can also send information back to the controller regarding the data read and/or written. Typically, a flexible printed circuit (FPC) is used to electrically transmit signals from the read-write head via a suspension tail to other electronics within an HDD. The FPC and the suspension tail are typically soldered together at a comb or "E-block" portion (see, e.g., carriage 134 of FIG. 1) of a head-stack assembly (HSA). Unwanted transfer of signals between communication channels, referred to as "crosstalk", is a well-known electronics phenomenon and is usually caused by undesired capacitance, inductive, or conductive coupling from one channel to another. In an HDD, crosstalk "noise" can occur between aggressor traces and victim traces, often from write signal traces to read signal traces. With crosstalk, the flow of data to/from the head may be compromised, and/or the reliability of the read transducer may be compromised as it is highly sensitive to over-bias voltage stress.

Any approaches that may be described in this section are approaches that could be pursued, but not necessarily approaches that have been previously conceived or pursued. Therefore, unless otherwise indicated, it should not be assumed that any of the approaches described in this section qualify as prior art merely by virtue of their inclusion in this section.

BRIEF DESCRIPTION OF THE DRAWINGS

Embodiments are illustrated by way of example, and not by way of limitation, in the figures of the accompanying drawings and in which like reference numerals refer to similar elements and in which.

DETAILED DESCRIPTION

Generally, approaches to avoiding crosstalk noise among flexible printed circuit electrical traces in a hard disk drive (HDD), are described. In the following description, for the purposes of explanation, numerous specific details are set forth in order to provide a thorough understanding of the embodiments of the invention described herein. It will be apparent, however, that the embodiments of the invention described herein may be practiced without these specific details. In other instances, well-known structures and devices may be shown in block diagram form in order to avoid unnecessarily obscuring the embodiments of the invention described herein.

INTRODUCTION

Terminology

References herein to "an embodiment", "one embodiment", and the like, are intended to mean that the particular feature, structure, or characteristic being described is included in at least one embodiment of the invention.

However, instances of such phrases do not necessarily all refer to the same embodiment or to every embodiment.

The term "substantially" will be understood to describe a feature that is largely or nearly structured, configured, dimensioned, etc., but with which manufacturing tolerances and the like may in practice result in a situation in which the structure, configuration, dimension, etc. is not always or necessarily precisely as stated. For example, describing a structure as "substantially vertical" would assign that term its plain meaning, such that the structure is vertical for all practical purposes but may not be precisely at 90 degrees throughout.

While terms such as "optimal", "optimize", "minimal", "minimize", "maximal", "maximize", and the like may not have certain values associated therewith, if such terms are used herein the intent is that one of ordinary skill in the art would understand such terms to include affecting a value, parameter, metric, and the like in a beneficial direction consistent with the totality of this disclosure. For example, describing a value of something as "minimal" does not require that the value actually be equal to some theoretical minimum (e.g., zero), but should be understood in a practical sense in that a corresponding goal would be to move the value in a beneficial direction toward a theoretical minimum.

Context

At a distal end of the suspension, there is a read-write transducer (or "head") to read and write data. At the other proximal end of the suspension, there are electrically conductive pads (or simply "electrical pads") to electrically connect to corresponding electrically conductive pads on a flexible printed circuit (FPC). The suspension pads and the FPC pads are typically electrically interconnected with solder or an ACF (anisotropic conductive film).

Figure 1:
FIG. 1 is a plan view illustrating a hard disk drive, according to an embodiment.
Figures 2A, 2B:
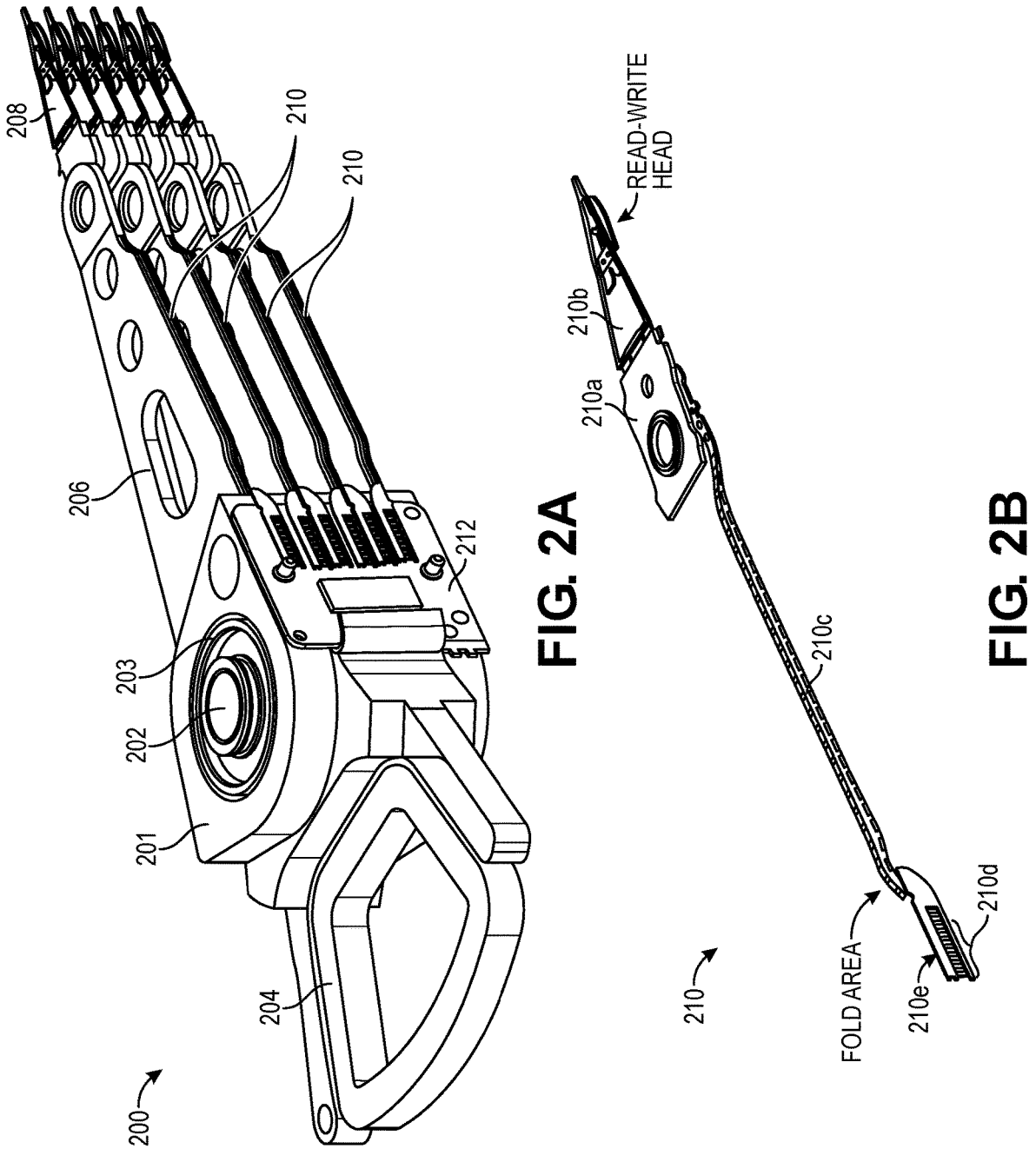
FIG. 2A is a perspective view illustrating an actuator assembly, according to an embodiment.
FIG. 2B is a perspective view illustrating an integrated lead suspension (ILS) of the actuator assembly of FIG. 2A, according to an embodiment.

FIG. 2A is a perspective view illustrating an actuator assembly, according to an embodiment. Actuator assembly 200 comprises a carriage 201 (see, e.g., carriage 134 of FIG. 1) rotatably coupled with a central pivot shaft 202 (see, e.g., pivot shaft 148 of FIG. 1) by way of a pivot bearing assembly 203 (see, e.g., pivot bearing assembly 152 of FIG. 1), and rotationally driven by a voice coil motor (VCM), of which a voice coil 204 is illustrated here. Actuator assembly 200 further comprises one or more actuator arm 206 (see, e.g., arm 132 of FIG. 1), to each of which is coupled a suspension assembly 208 (see, e.g., lead suspension 110c of FIG. 1) comprising a suspension 210, which typically comprises a swaged baseplate 210a (FIG. 2B) and a load beam 210b (see, e.g., load beam 110d of FIG. 1; FIG. 2B). Each suspension 210 is electrically connected with a flexible printed circuit (FPC) 212 coupled with the carriage 201, by way of a suspension tail 210c (FIG. 2B).

FIG. 2B is a perspective view illustrating an integrated lead suspension (ILS) of the actuator assembly of FIG. 2A, according to an embodiment. Suspension 210 comprises the baseplate 210a (e.g., swaged to a corresponding actuator arm 206 in the actuator assembly 200 of FIG. 2A) connected to the load beam 210b, to which the read-write head is attached at a distal end. Electrical signals are carried from the head and possibly other electronic components (such as a microactuator, for a non-limiting example) at the distal end to the FPC 212 (FIG. 2A) at the proximal end, by way of electrical leads integral to the suspension tail 210c. The suspension tail 210c has a fold at a fold area, beyond which in the proximal direction are located multiple electrical pads 210d on a suspension tail tip 210e. These electrical pads 210d are electrically connected to the FPC 212, in the actuator assembly 200, such as with solder or an ACF.

Figure 3A:
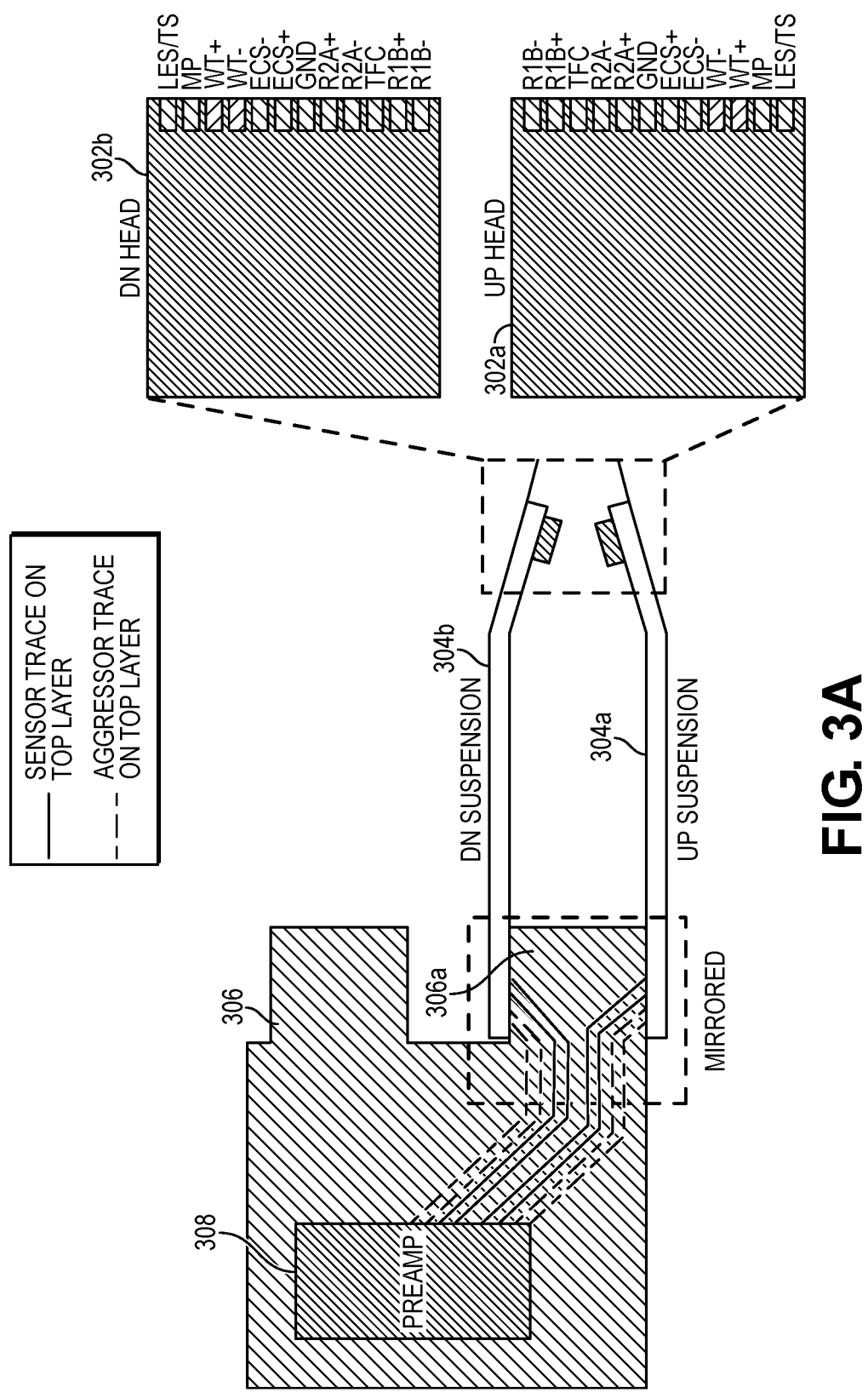
FIG. 3A is a diagram illustrating mirrored UP and DN read-write heads, according to an embodiment.
Figure 3B:
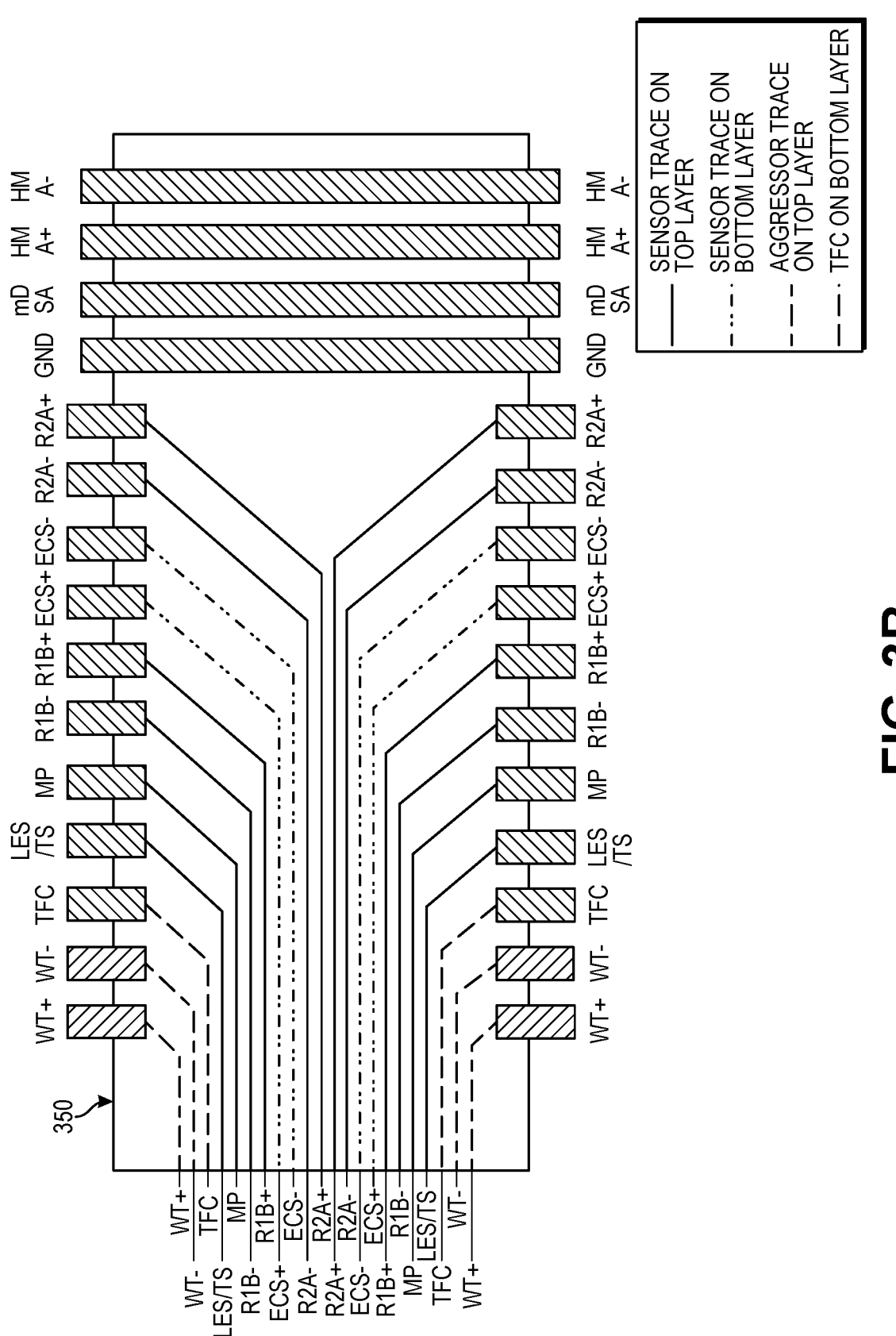
FIG. 3B is a diagram illustrating flexible printed circuit (FPC) mirrored trace layout for the UP and DN read-write heads of FIG. 3A, according to an embodiment.

FIG. 3A is a diagram illustrating mirrored UP and DN read-write heads, and FIG. 3B is a diagram illustrating flexible printed circuit (FPC) mirrored trace layout for the UP and DN read-write heads of FIG. 3A, both according to an embodiment. FIG. 3A depicts an UP head 302a (a read-write head facing upwards to service a bottom surface of a corresponding disk, not shown here but with reference to recording medium 120 of FIG. 1) mounted on a corresponding UP suspension 304a, and a DN head 302b (a read-write head facing downwards to service a top surface of the same disk) mounted on a corresponding DN suspension 304b. The electrical leads, wires, traces on each suspension 304a, 304b lead to a flexible printed circuit (FPC) 306 (see also FPC 212 of FIG. 2A) comprising one or more FPC finger(s) 306a (one detailed here, in an example shape) with which each suspension 304a, 304b is electrically and mechanically coupled, e.g., via solder pads. Therefore, each FPC finger 306a typically services both heads, UP head 302a and DN head 302b, electrically connecting each corresponding UP suspension 304a and DN suspension 304b to a preamp 308 (or beyond) mounted on the FPC 306. For reference, each FPC described in embodiments herein comprises a top wiring layer, a bottom wiring layer, a distal end in the direction of a head slider (e.g., UP head 302a, DN head 302b), and a proximal end in the direction of a preamp (e.g., preamp 308, an integrated circuit (IC) chip).

Historically, HDD manufacturers employed mirrored UP and DN read-write heads such as UP head 302a and DN head 302b. Mirrored heads have a mirrored pad layout between the heads (see FIG. 3A), so the FPC finger 306a of FPC 306 would likewise have a mirrored trace layout between UP and DN traces, as depicted in trace layout 350 of FIG. 3B. However, this continued development of each separate UP and DN head increases development costs. For cost reduction purposes, for example, one may prefer common heads to mirrored heads. Common heads would have the same pad layout between UP and DN heads, thus requiring a new pad layout for the FPC. As such, a new common head pad layout is reversed between UP and DN and likewise the FPC trace wiring layout is not mirrored between UP and DN traces.

Figure 4A:
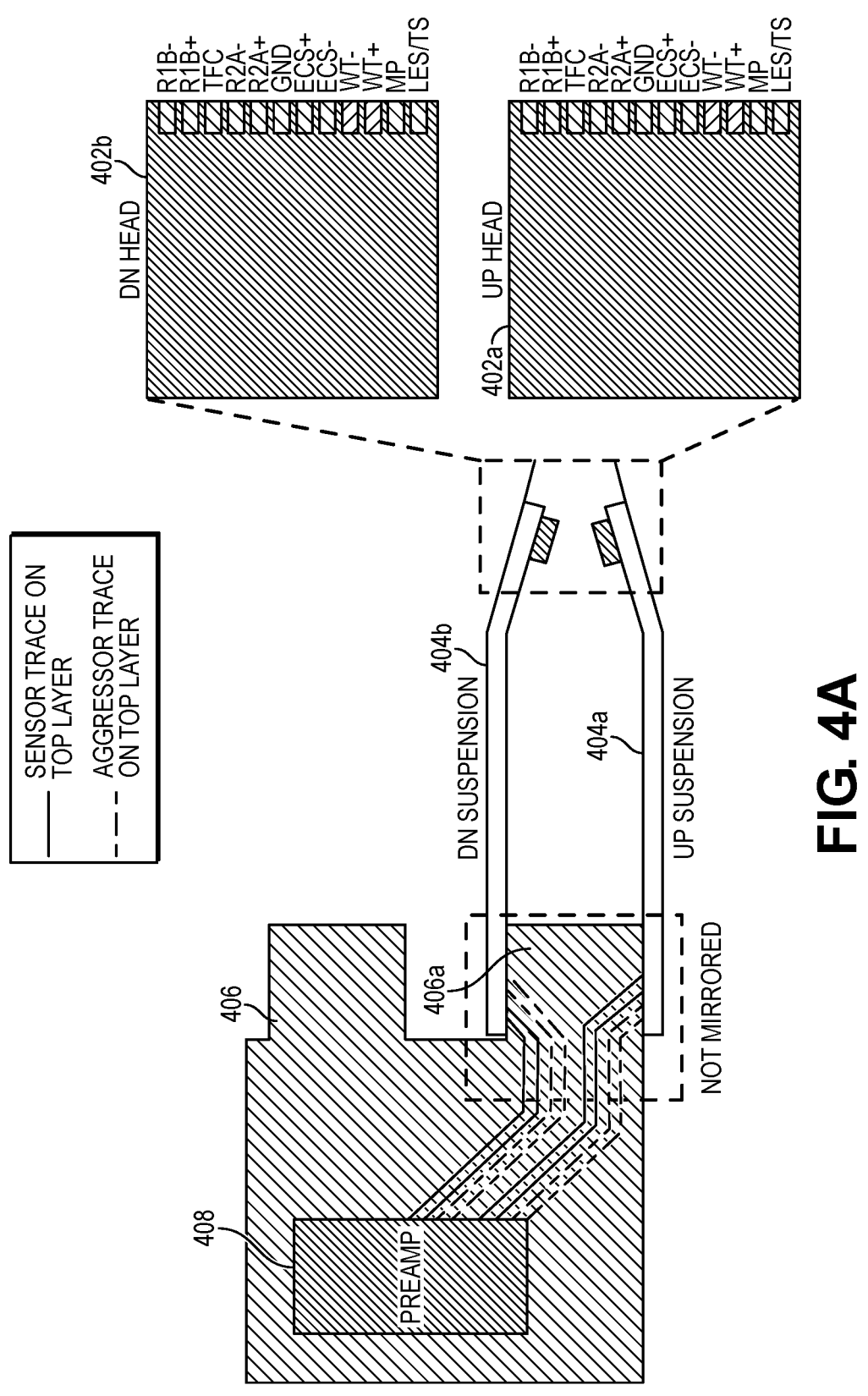
FIG. 4A is a diagram illustrating common UP and DN read-write heads, according to an embodiment.
Figure 4B:
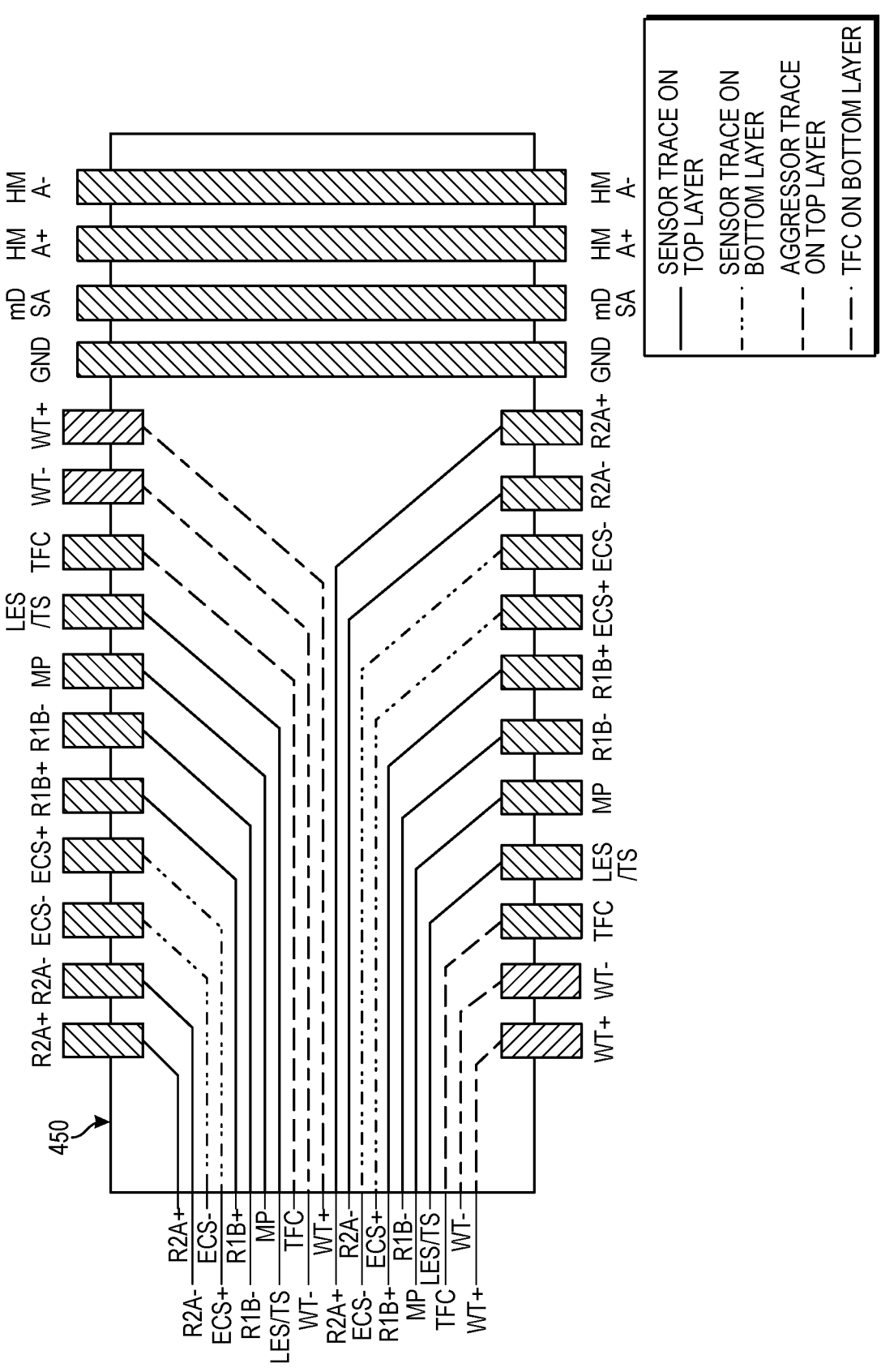
FIG. 4B is a diagram illustrating FPC trace layout for the common UP and DN read-write heads of FIG. 4A, according to an embodiment.

FIG. 4A is a diagram illustrating common UP and DN read-write heads, and FIG. 4B is a diagram illustrating FPC trace layout for the common UP and DN read-write heads of FIG. 4A, both according to an embodiment. FIG. 4A depicts an UP head 402a mounted on a corresponding UP suspension 404a, and a DN head 402b mounted on a corresponding DN suspension 404b. The electrical leads, wires, traces on each suspension 404a, 404b lead to a flexible printed circuit (FPC) 406 (see also FPC 212 of FIG. 2A) comprising one or more FPC finger(s) 406a (one detailed here, in an example shape) with which each suspension 404a, 404b is electrically and mechanically coupled, e.g., via solder pads. Therefore, each FPC finger 406a typically services both heads, UP head 402a and DN head 402b, electrically connecting each corresponding UP suspension 404a and DN suspension 404b to a preamp 408 (or beyond) mounted on the FPC 406.

However, this trace layout depicted in FIG. 4B would likely increase the crosstalk noise from aggressor traces (i.e., the WRITE traces, WT+ and WT−) to the nearby sensor traces (e.g., R2A+, R2A−) because the aggressor traces are wired in the center of the trace order, as depicted in trace layout 450 of FIG. 4B. One approach to this crosstalk problem may be to reorder the traces at the suspension tail tip area to a mirrored layout to maintain adequate distance between the aggressor and victim traces, if FPC geometry allows for such reorder routing. However, in scenarios with a 90-degree connection between the suspension tail and the FPC, there may not be enough space for reordering the trace layout in the tail tip area. Similarly, other approaches would likely need an expanded FPC finger outline to provide adequate spacing for further separating or blockading the aggressor and victim traces, but FPC finger width is constrained by the spacing between disks. Furthermore, increasing the conductor layers is another approach to improve signal isolation to reduce crosstalk, but adding additional conductor layers results in a significant cost increase. Thus, challenges remain with reducing the crosstalk noise from aggressor traces to sensor traces without occupying significant FPC space or adding additional conductor layers.

Figures 5A, 5B:
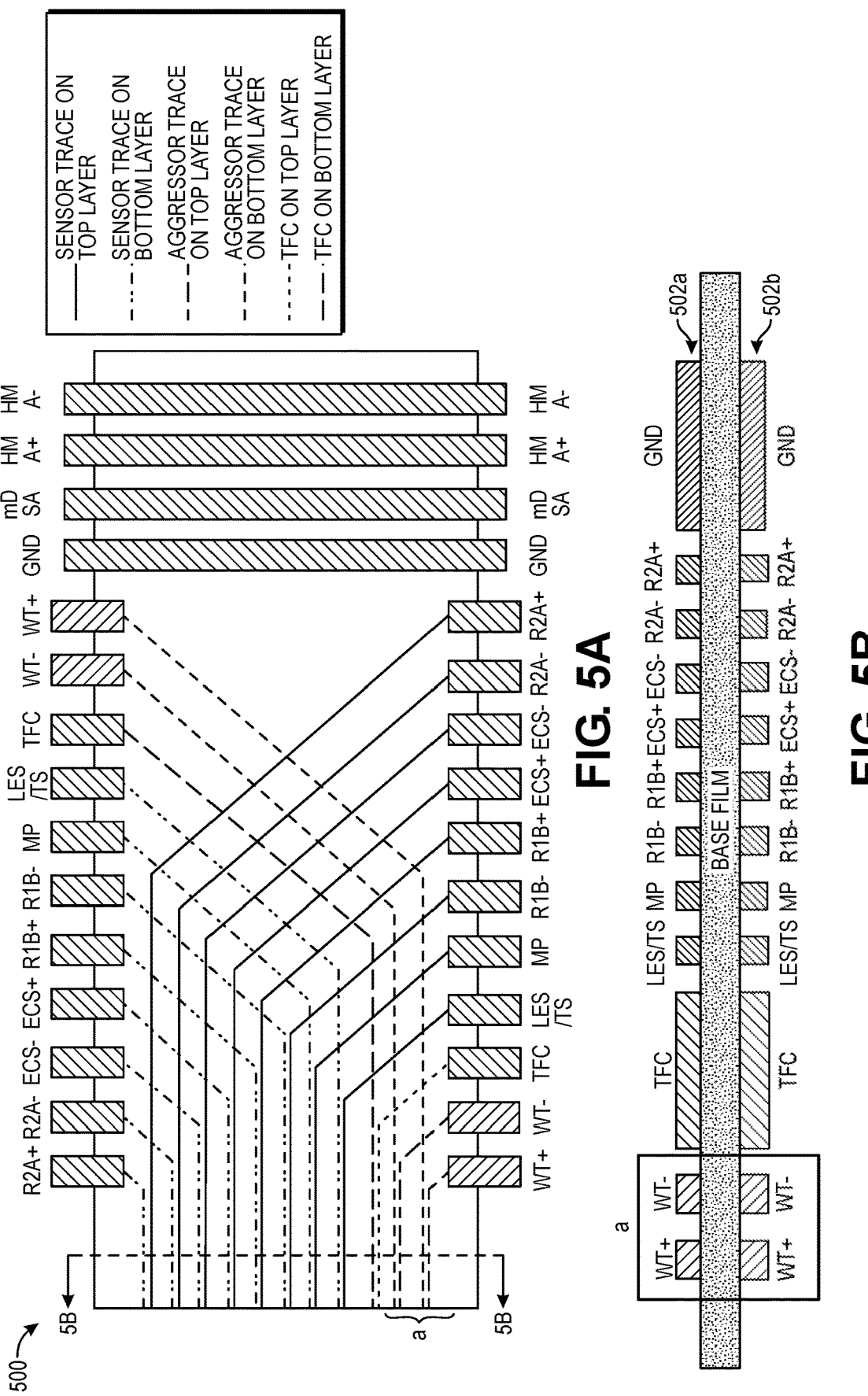
FIG. 5A is a diagram illustrating FPC trace layout for common UP and DN read-write heads, according to an embodiment.
FIG. 5B is a cross-section diagram illustrating the FPC trace layout of FIG. 5A, according to an embodiment.

Flexible Printed Circuit Trace Layouts for Reducing Crosstalk Aggressor Trace Isolation by Position FIG. 5A is a diagram illustrating FPC trace layout for common UP and DN read-write heads, and FIG. 5B is a cross-section diagram illustrating the FPC trace layout of FIG. 5A, both according to an embodiment. Trace layout 500 comprises a plurality of electrical traces, as illustrated and labeled throughout FIGS. 5A, 5B. Trace layout 500 may include more layers than as shown and thus may vary from implementation to implementation, where only the pertinent layers are shown here for simplicity and clarity. Here, all the sensor traces of UP head are wired on the top wiring layer 502a, and all the sensor traces of DN head are wired on the bottom wiring layer 502b. The cross-sectional view of FIG. 5B shows that the aggressor traces are positioned at the proximal end of each of the top wiring layer 502a and the bottom wiring layer 502b. That is, the "aggressor traces" corresponding to the WT+ (WRITE signal) and WT− (WRITE signal) traces for the UP head are routed on the top wiring layer 502a and the aggressor traces corresponding to the WT+ and WT− traces for the DN head are routed on the bottom wiring layer 502b. According to an embodiment and as depicted, all of the aggressor traces are positioned together at one edge of the proximal end, e.g., distanced from the victim sensor traces (e.g., R2A+(READ SIGNAL), R2A− (READ SIGNAL)). The read conductors are the primary crosstalk concern, with the read transducer corresponding to the data signal with a high sensitivity to over-bias voltage stress that can impact the reliability of the transducer. A secondary crosstalk with much less concern is associated with the other transducers related to fly-height controls, e.g., TFC (Thermal Flying height Control) and Embedded Contact Sensor (ECS), and other victim traces. According to an embodiment and as depicted, the aggressor traces are further isolated from the victim read traces by a pair of blockading TFC traces. Note that if the head pad layout is reversed between the UP head and DN head, then all the sensor traces of DN head would be wired on the top wiring layer 502a, and all the sensor traces of UP head would be wired on the bottom wiring layer 502b, with the aggressor traces still being positioned together at the proximal end of each of the top wiring layer 502a and the bottom wiring layer 502b (e.g., a reverse trace layout from that shown in FIG. 5B, whereby the aggressor traces are positioned together at the right edge rather than the left edge), and the same approach applies to isolating by positioning the aggressor traces from the sensor traces.

Figures 6A, 6B:
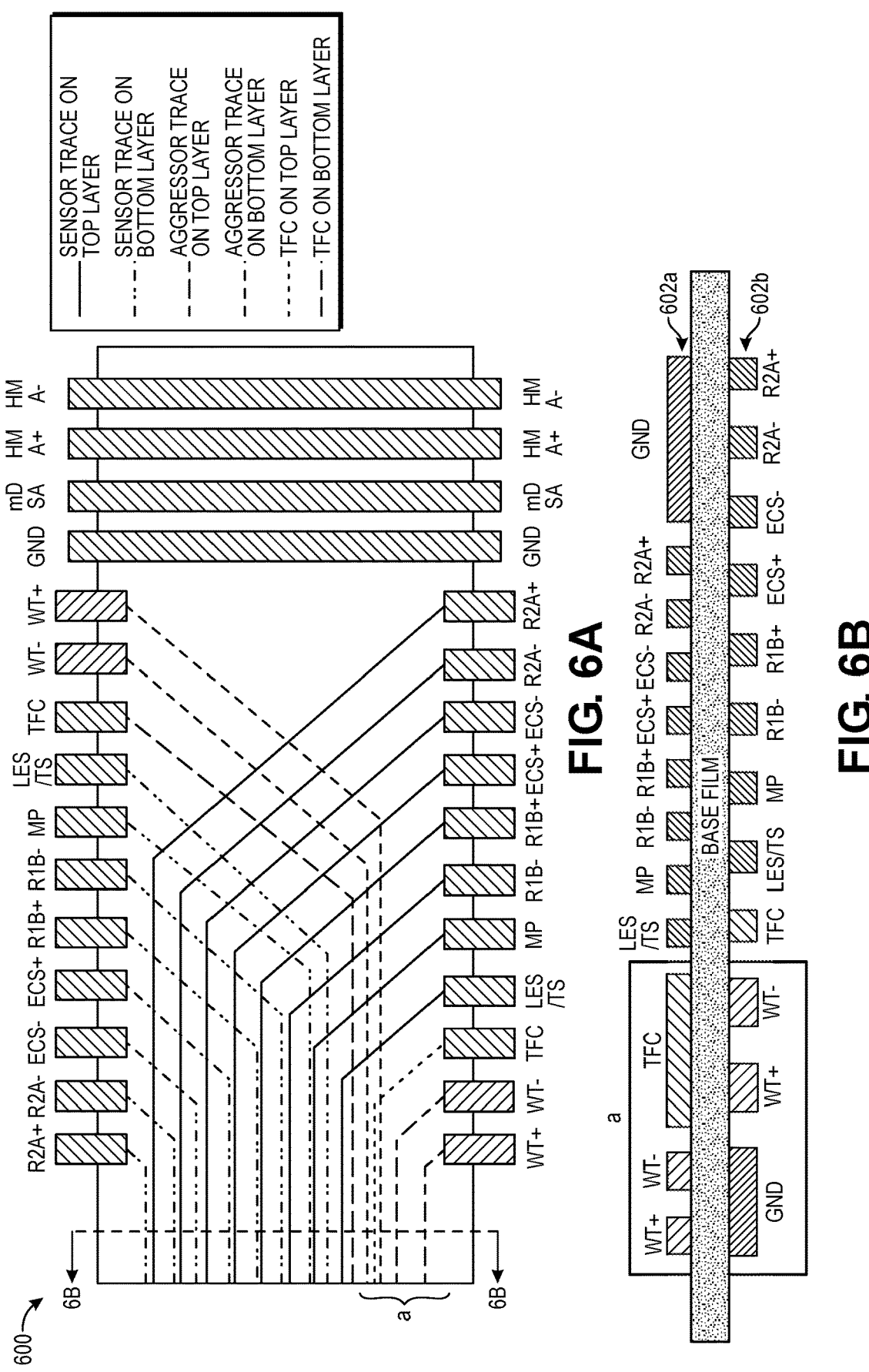
FIG. 6A is a diagram illustrating FPC trace layout with tuned impedance for common UP and DN read-write heads, according to an embodiment.
FIG. 6B is a cross-section diagram illustrating the FPC trace layout of FIG. 6A, according to an embodiment.

FIG. 6A is a diagram illustrating FPC trace layout with tuned impedance for common UP and DN read-write heads, and FIG. 6B is a cross-section diagram illustrating the FPC trace layout of FIG. 6A, both according to an embodiment. Trace layout 600 also comprises a plurality of electrical traces, as illustrated and labeled throughout FIGS. 6A, 6B. Trace layout 600 may include more layers than as shown and thus may vary from implementation to implementation, where only the pertinent layers are shown here for simplicity and clarity. Here too, all the sensor traces of UP head are wired on the top wiring layer 602a, and all the sensor traces of DN head are wired on the bottom wiring layer 602b. The cross-sectional view of FIG. 6B shows that the aggressor traces are positioned at (e.g., near) the proximal end of each of the top wiring layer 602a and the bottom wiring layer 602b. That is, the aggressor traces corresponding to the top pair of WT+ (WRITE signal) and WT− (WRITE signal) traces for the UP head are routed on the top wiring layer 602a and the aggressor traces corresponding to the bottom pair of WT+ and WT− traces for the DN head are routed on the bottom wiring layer 602b, in both cases distanced from the victim sensor traces R2A+ and R2A−. However, one distinction between the trace layout of FIGS. 5A, 5B and FIGS. 6A, 6B is that in scenarios in which the WT+ and WT− traces need to be tuned for impedance, then the impedance can be controlled by laying out each WT trace opposing (e.g., under or over) a TFC trace or a GND (ground) trace. However, all of the aggressor traces are still positioned together at one edge of the proximal end, e.g., distanced from the sensor traces. Note again that if the head pad layout is reversed between the UP head and DN head, then all the sensor traces of DN head would be wired on the top wiring layer 602a, and all the sensor traces of UP head would be wired on the bottom wiring layer 602b, with the aggressor traces still being positioned at (e.g., near) the proximal end of each of the top wiring layer 602a and the bottom wiring layer 602b (e.g., a reverse trace layout from that shown in FIG. 6B, whereby the aggressor traces are positioned together at the right edge rather than the left edge), and the same approach applies to isolating by positioning the aggressor traces from the sensor traces.

Aggressor Trace Isolation by Layer

Figures 7A, 7B:
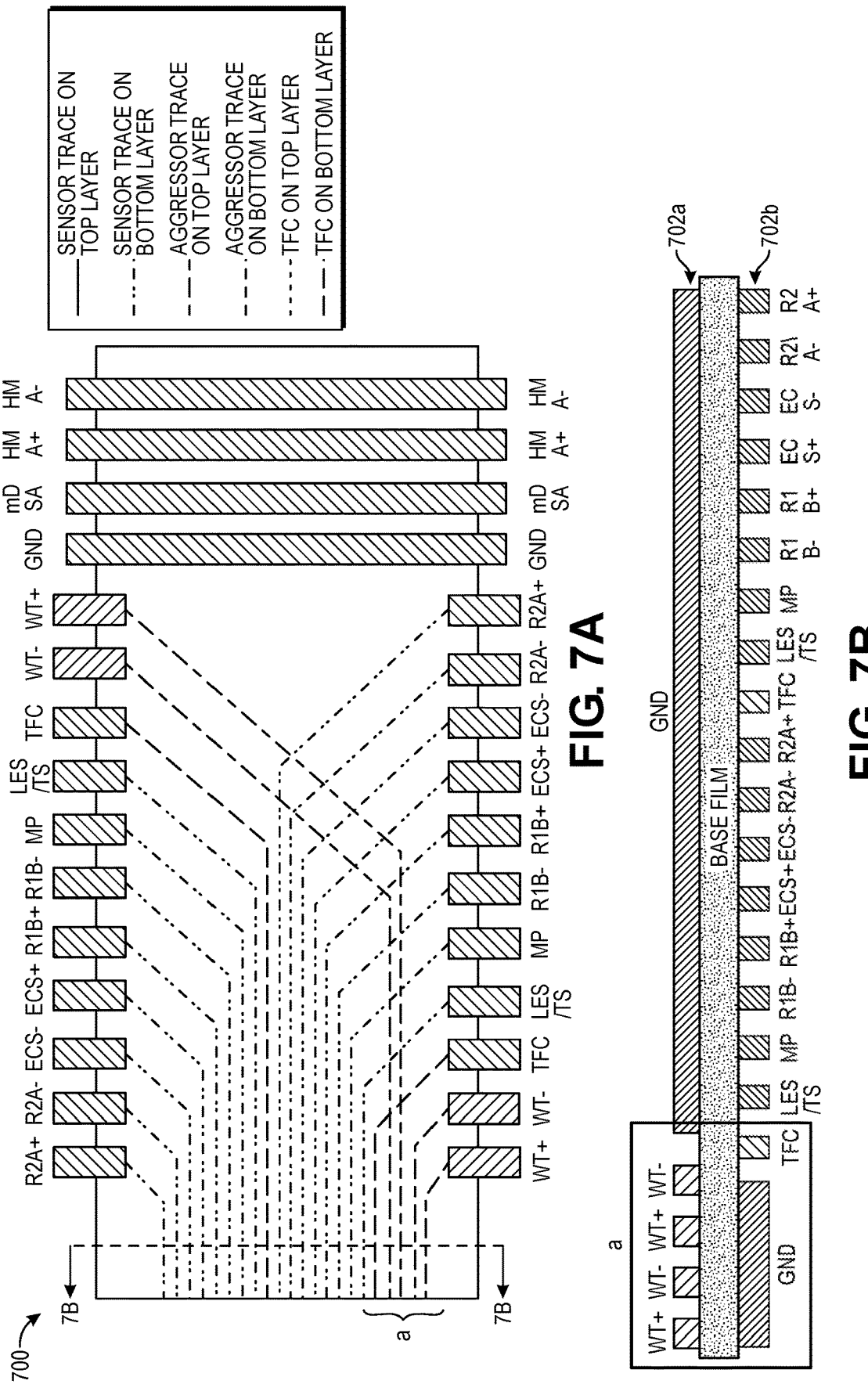
FIG. 7A is a diagram illustrating FPC trace layout for common UP and DN read-write heads, according to an embodiment.
FIG. 7B is a cross-section diagram illustrating the FPC trace layout of FIG. 7A, according to an embodiment.

FIG. 7A is a diagram illustrating FPC trace layout for common UP and DN read-write heads, and FIG. 7B is a cross-section diagram illustrating the FPC trace layout of FIG. 7A, both according to an embodiment. Trace layout 700 comprises a plurality of electrical traces, as illustrated and labeled throughout FIGS. 7A, 7B. Trace layout 700 may include more layers than as shown and thus may vary from implementation to implementation, where only the pertinent layers are shown here for simplicity and clarity. Here, the cross-sectional view of FIG. 7B shows that all the sensor traces of both the UP head and the DN head are wired on the bottom wiring layer 702b, and all the aggressor traces are positioned at the proximal end of the top wiring layer 702a, e.g., distanced from the sensor traces. That is, the "aggressor traces" corresponding to the WT+ (WRITE signal) and WT− (WRITE signal) traces for the UP head and the aggressor traces corresponding to the WT+ and WT− traces for the DN head are all routed on the top wiring layer 702a, while all the victim sensor traces (e.g., both R2A+(READ SIGNAL) and both R2A− (READ SIGNAL)) are routed on the bottom wiring layer 702b. According to an embodiment and as depicted, all of the aggressor traces are positioned together at one edge of the proximal end, e.g., distanced from the victim sensor traces by both position and layer. According to an embodiment and as depicted in FIG. 7B, if the WT+ and WT− traces need to be tuned for impedance then the impedance can be controlled by laying out each WT trace opposing (e.g., under or over) a GND (ground) trace. Note that if the head pad layout is reversed between the UP head and DN head, or if the top wiring layer 702a and bottom wiring layer 702b are reversed, then all the sensor traces would be wired on the top wiring layer 702a and all the aggressor traces would be wired on the bottom wiring layer 702b, and the same approach applies to isolating by layer the aggressor traces from the sensor traces.

Multilayer Aggressor Trace Routing

Figures 8A, 8B:
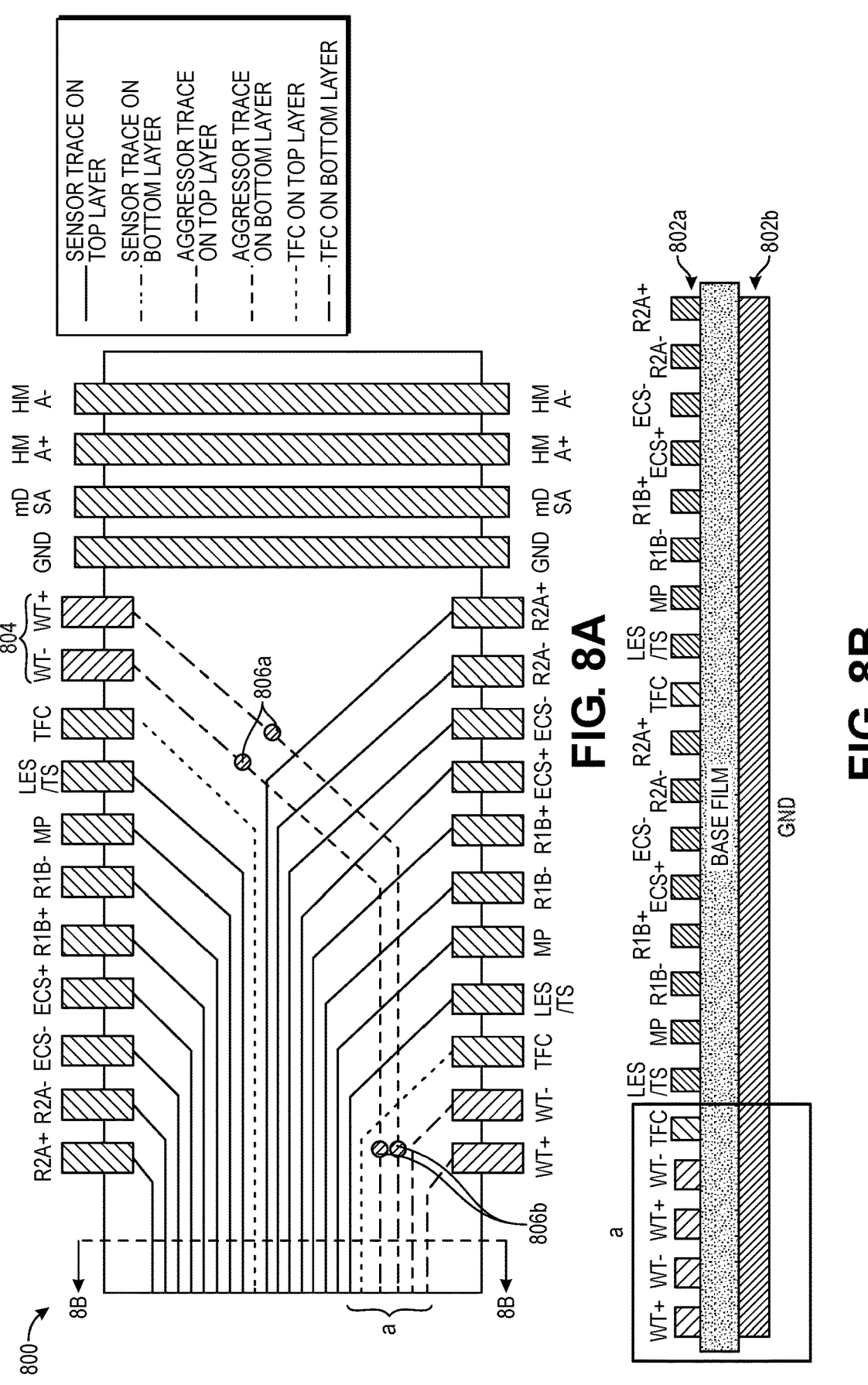
FIG. 8A is a diagram illustrating FPC trace layout for common UP and DN read-write heads, according to an embodiment.
FIG. 8B is a cross-section diagram illustrating the FPC trace layout of FIG. 8A, according to an embodiment.

FIG. 8A is a diagram illustrating FPC trace layout for common UP and DN read-write heads, and FIG. 8B is a cross-section diagram illustrating the FPC trace layout of FIG. 8A, both according to an embodiment. Trace layout 800 comprises a plurality of electrical traces, as illustrated and labeled throughout FIGS. 8A, 8B. Trace layout 800 may include more layers than as shown and thus may vary from implementation to implementation, where only the pertinent layers are shown here for simplicity and clarity. Here, the cross-sectional view of FIG. 8B shows that all the sensor traces of both the UP head and the DN head are wired together on the top wiring layer 802a and all the aggressor traces are also positioned at the proximal end of the top wiring layer 802a, e.g., distanced from the sensor traces. That is, the "aggressor traces" corresponding to the WT+ (WRITE signal) and WT− (WRITE signal) traces for the UP head and the aggressor traces corresponding to the WT+ and WT− traces for the DN head are all routed on the top wiring layer 802a, along with all the victim sensor traces (e.g., both R2A+(READ SIGNAL) and both R2A− (READ SIGNAL)) also being routed on the top wiring layer 802a. According to an embodiment and as depicted, all of the aggressor traces are positioned together at one edge of the proximal end, e.g., distanced from the victim sensor traces by position.

According to an embodiment, one pair of the aggressor traces (i.e., the pair furthest from the proximal end) is routed away from the victim traces, by way of vias, to the wiring layer opposing the layer on which the aggressor traces are grouped at the proximal end. For example and as depicted in FIG. 8A, the top pair of aggressor traces 804 begin on the top wiring layer 802a, are routed to the bottom wiring layer 802b by way of a first corresponding pair of vias 806a to route under and avoid the sensor traces, and are then routed back to the top wiring layer 802a on which the aggressor traces are grouped at the proximal end, by way of a corresponding second pair of vias 806b. Note that if the head pad layout is reversed between the UP head and DN head, or if the top wiring layer 802a and bottom wiring layer 802b are reversed, then all the aggressor traces and all the sensor traces would be wired on the bottom wiring layer 802b, and the same approach applies to isolating by multilayer routing the aggressor traces from the sensor traces. According to an embodiment and as depicted in FIG. 8B, a ground layer (or ground plane) is positioned on the wiring layer opposing the aggressor and sensor traces.

Physical Description of an Illustrative Operating Context

Embodiments may be used in the context of a digital data storage device (DSD) such as a hard disk drive (HDD). Thus, in accordance with an embodiment, a plan view illustrating a conventional HDD 100 is shown in FIG. 1 to aid in describing how a conventional HDD typically operates.

FIG. 1 illustrates the functional arrangement of components of the HDD 100 including a slider 110b that includes a magnetic read-write head 110a. Collectively, slider 110b and head 110a may be referred to as a head slider. The HDD 100 includes at least one head gimbal assembly (HGA) 110 including the head slider, a lead suspension 110c attached to the head slider typically via a flexure, and a load beam 110d attached to the lead suspension 110c. The HDD 100 also includes at least one recording medium 120 rotatably mounted on a spindle 124 and a drive motor (not visible) attached to the spindle 124 for rotating the medium 120. The read-write head 110a, which may also be referred to as a transducer, includes a write element and a read element for respectively writing and reading information stored on the medium 120 of the HDD 100. The medium 120 or a plurality of disk media may be affixed to the spindle 124 with a disk clamp 128.

The HDD 100 further includes an arm 132 attached to the HGA 110, a carriage 134, a voice-coil motor (VCM) that includes an armature 136 including a voice coil 140 attached to the carriage 134 and a stator 144 including a voice-coil magnet (not visible). The armature 136 of the VCM is attached to the carriage 134 and is configured to move the arm 132 and the HGA 110 to access portions of the medium 120, all collectively mounted on a pivot shaft 148 with an interposed pivot bearing assembly 152. In the case of an HDD having multiple disks, the carriage 134 may be referred to as an "E-block," or comb, because the carriage is arranged to carry a ganged array of arms that gives it the appearance of a comb.

An assembly comprising a head gimbal assembly (e.g., HGA 110) including a flexure to which the head slider is coupled, an actuator arm (e.g., arm 132) and/or load beam to which the flexure is coupled, and an actuator (e.g., the VCM) to which the actuator arm is coupled, may be collectively referred to as a head-stack assembly (HSA). An HSA may, however, include more or fewer components than those described. For example, an HSA may refer to an assembly that further includes electrical interconnection components. Generally, an HSA is the assembly configured to move the head slider to access portions of the medium 120 for read and write operations.

With further reference to FIG. 1, electrical signals (e.g., current to the voice coil 140 of the VCM) comprising a write signal to and a read signal from the head 110a, are transmitted by a flexible cable assembly (FCA) 156 (or "flex cable", or "flexible printed circuit" (FPC)). Interconnection between the flex cable 156 and the head 110a may include an arm-electronics (AE) module 160, which may have an on-board pre-amplifier for the read signal, as well as other read-channel and write-channel electronic components. The AE module 160 may be attached to the carriage 134 as shown. The flex cable 156 may be coupled to an electrical-connector block 164, which provides electrical communication, in some configurations, through an electrical feed-through provided by an HDD housing 168. The HDD housing 168 (or "enclosure base" or "baseplate" or simply "base"), in conjunction with an HDD cover, provides a semi-sealed (or hermetically sealed, in some configurations) protective enclosure for the information storage components of the HDD 100.

Other electronic components, including a disk controller and servo electronics including a digital-signal processor (DSP), provide electrical signals to the drive motor, the voice coil 140 of the VCM and the head 110a of the HGA 110. The electrical signal provided to the drive motor enables the drive motor to spin providing a torque to the spindle 124 which is in turn transmitted to the medium 120 that is affixed to the spindle 124. As a result, the medium 120 spins in a direction 172. The spinning medium 120 creates a cushion of air that acts as an air-bearing on which the air-bearing surface (ABS) of the slider 110b rides so that the slider 110b flies above the surface of the medium 120 without making contact with a thin magnetic-recording layer in which information is recorded. Similarly in an HDD in which a lighter-than-air gas is utilized, such as helium for a non-limiting example, the spinning medium 120 creates a cushion of gas that acts as a gas or fluid bearing on which the slider 110*b* rides.

The electrical signal provided to the voice coil 140 of the VCM enables the head 110*a* of the HGA 110 to access a track 176 on which information is recorded. Thus, the armature 136 of the VCM swings through an arc 180, which enables the head 110*a* of the HGA 110 to access various tracks on the medium 120. Information is stored on the medium 120 in a plurality of radially nested tracks arranged in sectors on the medium 120, such as sector 184. Correspondingly, each track is composed of a plurality of sectored track portions (or "track sector") such as sectored track portion 188. Each sectored track portion 188 may include recorded information, and a header containing error correction code information and a servo-burst-signal pattern, such as an ABCD-servo-burst-signal pattern, which is information that identifies the track 176. In accessing the track 176, the read element of the head 110*a* of the HGA 110 reads the servo-burst-signal pattern, which provides a position-error-signal (PES) to the servo electronics, which controls the electrical signal provided to the voice coil 140 of the VCM, thereby enabling the head 110*a* to follow the track 176. Upon finding the track 176 and identifying a particular sectored track portion 188, the head 110*a* either reads information from the track 176 or writes information to the track 176 depending on instructions received by the disk controller from an external agent, for example, a microprocessor of a computer system.

An HDD's electronic architecture comprises numerous electronic components for performing their respective functions for operation of an HDD, such as a hard disk controller ("HDC"), an interface controller, an arm electronics module, a data channel, a motor driver, a servo processor, buffer memory, etc. Two or more of such components may be combined on a single integrated circuit board referred to as a "system on a chip" ("SOC"). Several, if not all, of such electronic components are typically arranged on a printed circuit board that is coupled to the bottom side of an HDD, such as to HDD housing 168.

References herein to a hard disk drive, such as HDD 100 illustrated and described in reference to FIG. 1, may encompass an information storage device that is at times referred to as a "hybrid drive". A hybrid drive refers generally to a storage device having functionality of both a traditional HDD (see, e.g., HDD 100) combined with solid-state storage device (SSD) using non-volatile memory, such as flash or other solid-state (e.g., integrated circuits) memory, which is electrically erasable and programmable. As operation, management and control of the different types of storage media typically differ, the solid-state portion of a hybrid drive may include its own corresponding controller functionality, which may be integrated into a single controller along with the HDD functionality. A hybrid drive may be architected and configured to operate and to utilize the solid-state portion in a number of ways, such as, for non-limiting examples, by using the solid-state memory as cache memory, for storing frequently-accessed data, for storing I/O intensive data, and the like. Further, a hybrid drive may be architected and configured essentially as two storage devices in a single enclosure, i.e., a traditional HDD and an SSD, with either one or multiple interfaces for host connection.

Hence, approaches to avoiding crosstalk in a FPC of a HDD are described, whereby aggressor traces such as those carrying WRITE signals are in some way distanced and/or isolated from associated victim traces such as those carrying READ signals. These approaches are described herein mainly in the context of an HDD configuration in which common head sliders are implemented, and in the context of WRITE and READ traces, however, these approaches and techniques for avoiding or limiting crosstalk are not necessarily limited to configurations with common heads and head pad layouts or to configurations in which HDD WRITE signals correspond to the aggressor traces and HDD READ signals correspond to victim traces. That is, these signal/trace isolation techniques can be used in other scenarios involving undesired crosstalk.

EXTENSIONS AND ALTERNATIVES

In the foregoing description, embodiments of the invention have been described with reference to numerous specific details that may vary from implementation to implementation. Therefore, various modifications and changes may be made thereto without departing from the broader spirit and scope of the embodiments. Thus, the sole and exclusive indicator of what is the invention, and is intended by the applicants to be the invention, is the set of claims that issue from this application, in the specific form in which such claims issue, including any subsequent correction. Any definitions expressly set forth herein for terms contained in such claims shall govern the meaning of such terms as used in the claims. Hence, no limitation, element, property, feature, advantage or attribute that is not expressly recited in a claim should limit the scope of such claim in any way. The specification and drawings are, accordingly, to be regarded in an illustrative rather than a restrictive sense.

In addition, in this description certain process steps may be set forth in a particular order, and alphabetic and alphanumeric labels may be used to identify certain steps. Unless specifically stated in the description, embodiments are not necessarily limited to any particular order of carrying out such steps. In particular, the labels are used merely for convenient identification of steps, and are not intended to specify or require a particular order of carrying out such steps.

What is claimed is:

1. A flexible printed circuit (FPC) for a hard disk drive, the FPC having a top wiring layer having opposing lateral edges extending longitudinally, a bottom wiring layer having opposing lateral edges extending longitudinally, and a proximal end in the direction of a preamp, the FPC comprising:

a plurality of electrical traces comprising:

two pairs of aggressor traces, configured to carry signals that can interfere with signals carried by victim traces, grouped together at one lateral edge of the proximal end of either the top wiring layer or the bottom wiring layer; and the victim traces positioned on the same top wiring layer or bottom wiring layer as the aggressor traces;

wherein at least one pair of the aggressor traces is routed away from the victim traces, by way of first vias, to the top wiring layer or the bottom wiring layer opposing the layer at which the aggressor traces are grouped at the one lateral edge of the proximal end.

2. The FPC of claim 1, wherein the at least one pair of the aggressor traces is routed, by way of second vias, back to the top wiring layer or the bottom wiring layer at which the aggressor traces are grouped at the one lateral edge of the proximal end.

3. The FPC of claim 1, wherein the aggressor traces are positioned adjacently at the one lateral edge of the proximal end.

4. The FPC of claim 1, wherein:

the aggressor traces are configured to carry write signals; and the victim traces are configured to carry read signals.

5. The FPC of claim 1, wherein the aggressor traces are grouped together at the proximal end of the top wiring layer, the FPC further comprising:

a ground plane positioned at the proximal end of the bottom wiring layer.

6. The FPC of claim 1, wherein the aggressor traces are grouped together at the proximal end of the bottom wiring layer, the FPC further comprising:

a ground plane positioned at the proximal end of the top wiring layer.

7. A hard disk drive comprising the FPC of claim 1.

8. A method of manufacturing a flexible printed circuit (FPC) having a top wiring layer having opposing lateral edges extending longitudinally, a bottom wiring layer having opposing lateral edges extending longitudinally, and a proximal end in the direction of a preamp, the method comprising:

forming a plurality of electrical traces comprising:

forming two pairs of aggressor traces, configured to carry signals that can interfere with signals carried by victim traces, grouped together at one lateral edge of the proximal end of either the top wiring layer or the bottom wiring layer; and forming the victim traces positioned on the same top wiring layer or bottom wiring layer as the aggressor traces;

wherein forming the aggressor traces includes routing at least one pair of the aggressor traces away from the victim traces, including forming first vias through which the at least one pair is routed away from the victim traces, to the top wiring layer or the bottom wiring layer opposing the layer at which the aggressor traces are grouped at the one lateral edge of the proximal end.

9. The method of claim 8, wherein forming the aggressor traces includes routing the at least one pair, including forming second vias through which the at least one pair is routed back to the top wiring layer or the bottom wiring layer at which the aggressor traces are grouped at the one lateral edge of the proximal end.

10. The method of claim 8, wherein forming the aggressor traces includes forming the aggressor traces positioned adjacently at the one lateral edge of the proximal end.

11. The method of claim 8, wherein:

forming the aggressor traces includes configuring the aggressor traces to carry write signals; and forming the victim traces includes configuring the victim traces to carry read signals.

12. The method of claim 8, wherein forming the aggressor traces includes grouping the aggressor traces together at the proximal end of the top wiring layer, the method further comprising:

forming a ground plane positioned at the proximal end of the bottom wiring layer.

13. The method of claim 8, wherein forming the aggressor traces includes grouping the aggressor traces together at the proximal end of the bottom wiring layer, the method further comprising:

forming a ground plane positioned at the proximal end of the top wiring layer.

14. The FPC of claim 1, wherein the aggressor traces are configured to carry write signals.

15. The FPC of claim 5, wherein the at least one pair of the aggressor traces is routed away from the victim traces by way of the first vias to the bottom wiring layer.

16. The FPC of claim 6, wherein the at least one pair of the aggressor traces is routed away from the victim traces by way of the first vias to the top wiring layer.

17. The method of claim 8, wherein forming the aggressor traces includes configuring the aggressor traces to carry write signals.

18. The method of claim 12, wherein the at least one pair of the aggressor traces is routed away from the victim traces by way of the first vias to the bottom wiring layer.

19. The method of claim 13, wherein the at least one pair of the aggressor traces is routed away from the victim traces by way of the first vias to the top wiring layer.

* * * * *